United States Patent
Tao et al.

(10) Patent No.: US 12,453,230 B2
(45) Date of Patent: Oct. 21, 2025

(54) DISPLAY PANEL AND DISPLAY APPARATUS

(71) Applicant: Hefei Visionox Technology Co., Ltd., Anhui (CN)

(72) Inventors: Zichao Tao, Anhui (CN); Jiuzhan Zhang, Anhui (CN); Quan Liu, Anhui (CN); Zhenzhen Han, Anhui (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 478 days.

(21) Appl. No.: 17/990,128

(22) Filed: Nov. 18, 2022

(65) Prior Publication Data

US 2023/0086876 A1 Mar. 23, 2023

Related U.S. Application Data

(63) Continuation of application No. PCT/CN2021/108701, filed on Jul. 27, 2021.

(30) Foreign Application Priority Data

Oct. 30, 2020 (CN) .......................... 202011196958.4

(51) Int. Cl.
*H10H 29/14* (2025.01)
*H10D 86/40* (2025.01)
(Continued)

(52) U.S. Cl.
CPC ........ *H10H 29/142* (2025.01); *H10D 86/441* (2025.01); *H10D 86/60* (2025.01); *H10H 20/857* (2025.01)

(58) Field of Classification Search
CPC .. H10H 29/142; H10H 20/857; H10D 86/441; H10D 86/60; H10D 86/423;
(Continued)

(56) References Cited

U.S. PATENT DOCUMENTS 11,199,922 B2 * 12/2021 Jeong .................... H10K 59/40
2021/0193746 A1 * 6/2021 Lee ....................... G09G 3/3266

FOREIGN PATENT DOCUMENTS

| CN | 101373303 A | 2/2009 |
| CN | 105679768 A | 6/2016 |

(Continued)

OTHER PUBLICATIONS

International Search Report mailed on Oct. 20, 2021, in International Application No. PCT/CN2021/108701, 7 pages.
(Continued)

*Primary Examiner* — Tan N Tran
(74) *Attorney, Agent, or Firm* — Maier & Maier, PLLC

(57) ABSTRACT

A display panel and a display apparatus, including: a first display area and a second display area at least partially surrounding the first display area, the second display area includes: a light-emitting element layer including a plurality of sub-pixels disposed in an array; and a pixel circuit layer being arranged with a plurality of pixel circuits and including a plurality of intermediate film layers, the plurality of intermediate film layers are arranged in a stacked manner and insulated from each other, each of the intermediate film layers includes a plurality of modules disposed to be insulated from each other.

20 Claims, 6 Drawing Sheets

(51) Int. Cl.
*H10D 86/60* (2025.01)
*H10H 20/857* (2025.01)

(58) Field of Classification Search
CPC ......... H10D 86/40; H01L 25/167; G09F 9/30; G09F 9/302; H04N 23/57
See application file for complete search history.

(56) References Cited

FOREIGN PATENT DOCUMENTS

| | | |
|---|---|---|
| CN | 110047386 A | 7/2019 |
| CN | 110516637 A | 11/2019 |
| CN | 110707139 A | 1/2020 |
| CN | 111048573 A | 4/2020 |
| CN | 111754934 A | 10/2020 |
| CN | 112234092 A | 1/2021 |
| CN | 112289194 A | 1/2021 |
| KR | 1020060048203 A | 5/2006 |
| KR | 1020170114027 A | 10/2017 |
| KR | 1020180001978 A | 1/2018 |
| KR | 101972574 B1 | 4/2019 |

OTHER PUBLICATIONS

Office Action mailed on Dec. 1, 2021, in Chinese Patent Application No. 202011196958.4, 19 pages.
Office Action issued on Nov. 18, 2024, in corresponding Korean Application No. 10-2022-7040741, 15 pages.
Office Action issued on Jul. 18, 2025, in corresponding Korean Application No. 10-2022-7040741, 6 pages.

\* cited by examiner

DISPLAY PANEL AND DISPLAY APPARATUS

CROSS REFERENCE TO RELATED APPLICATION

The present application is a continuation of International Application No. PCT/CN2021/108701 filed on Jul. 27, 2021, which claims the benefit of priority to Chinese Patent Application No. 202011196958.4 filed on Oct. 30, 2020, both of which are incorporated herein by reference in their entireties.

TECHNICAL FIELD

The present application relates to the field of display devices, and particularly to a display panel and a display apparatus.

BACKGROUND

In recent years, in order to achieve a full-screen display, mobile terminal products with a notch screen, a water drop screen and a holed screen have been developed successively. These products all utilize a design scheme in which the pixel drive circuit at a specific location in the display panel is removed, and a component such as a camera is integrated at this specific location. Such a design will cause that in the display screen of the product, the brightness of the display area above the camera is different from that of the display areas at other locations, thus the screen split phenomenon occurs and the display effect of the product is poor.

SUMMARY

The embodiments of the present application provide a display panel and a display apparatus, which can reduce the performance difference of the same components, reduce or even eliminate the screen split phenomenon of the display panel, and improve the display effect.

A first aspect of the embodiments of the present application provides a display panel including a first display area and a second display area at least partially surrounding the first display area, a light transmittance of the first display area being greater than a light transmittance of the second display area, the second display area including: a light-emitting element layer including a plurality of sub-pixels disposed in an array; and a pixel circuit layer being arranged with a plurality of pixel circuits in one-to-one correspondence with the plurality of sub-pixels and including a plurality of intermediate film layers for forming transistors in the pixel circuits, the plurality of intermediate film layers being arranged in a stacked manner and insulated from each other, each of the intermediate film layers including a plurality of modules disposed to be insulated from each other, each of the modules including functional parts for forming the transistors and non-functional parts for connecting adjacent two of the functional parts, and in at least part of the modules, at least part of the functional parts being disposed in a different layer from the non-functional parts.

The embodiments of the present application further provide a display panel including a first display area and a second display area at least partially surrounding the first display area, a light transmittance of the first display area being greater than a light transmittance of the second display area, the second display area including: a light-emitting element layer including a plurality of sub-pixels disposed in an array; and a pixel circuit layer including a plurality of pixel circuits in one-to-one correspondence with the plurality of sub-pixels and second metal layers for forming upper plates of capacitors, and the second metal layers of every adjacent two of the pixel circuits being spaced apart from each other.

The embodiments of the present application further provide a display apparatus including any one of the display panels according to the above technical solutions.

In the display panel according to the embodiments of the present application, by reducing the area difference of the portions, which are located in a same layer and continuous, of various film layers for forming the same components, the performance difference of the same components is reduced, the screen split phenomenon of the display panel is reduced or even eliminated, and the display effect is improved, in which the various film layers include one or more of intermediate film layers for forming transistors and second metal layers for forming upper plates of capacitors.

BRIEF DESCRIPTION OF THE DRAWINGS

In order to more clearly illustrate the technical solutions of the embodiments of the present application, the drawings to be used in the embodiments of the present application will be briefly described below. Obviously, the drawings described below are merely some embodiments of the present application, and for those of ordinary skill in the art, other drawings can be obtained based on these drawings without inventive effort.

DETAILED DESCRIPTION

Figure 1:
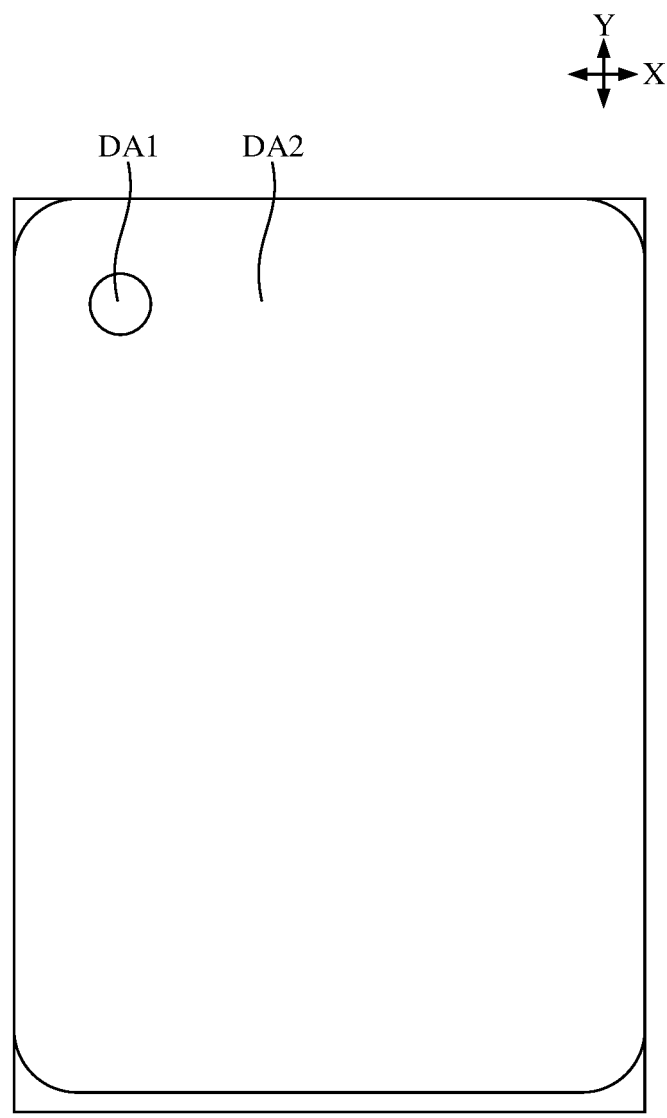
FIG. 1 shows a schematic top view of a display panel according to an embodiment of the present application.

Features and exemplary embodiments of various aspects of the present application will be described in detail below. In the following detailed description, numerous specific details are set forth to provide a thorough understanding of the present application. Nonetheless, it is obvious to those skilled in the art that the present application can be practiced without some of these specific details. The following description of the embodiments is merely to provide a better understanding of the present application by illustrating examples of the present application.

In the present application, the relational terms such as first and second are merely used to distinguish one entity or operation from another entity or operation, and do not necessarily require or imply the existence of such actual relationship or sequence between these entities or operations.

When the structure of a component is described, if a layer or region is referred to as being "on" or "over" another layer or region, the layer or region can be directly on another layer or region, or other layers or regions are further included between the layer or region and another layer or region. Moreover, if the component is flipped, the layer or region will be "below" or "beneath" another layer or area.

For a better understanding of the present application, the display panel 110 and display apparatus according to the embodiments of the present application will be described in detail below with reference to FIGS. 1 to 7.

In a display panel of the related art which includes a first display area and a second display area at least partially surrounding the first display area, the first display area is configured to dispose a component such as a camera, and the first display area includes a light-emitting element layer which is in a same layer and continuous as the second display area but does not include a pixel circuit layer. That is, in the manufacturing process, the area of the pixel circuit layer corresponding to the first display area is removed to form an area for arranging the component such as a camera; after the area of the pixel circuit layer corresponding to the first display area is removed, some components such as transistors and capacitors in the pixel circuit layer will be missing, thus the components located in the same row or column as the missing components are differently affected by the process compared with other components, and the characteristics of the components located in the same row or column as the missing components are varied, mainly in that the components located in the same row or column as the missing components are differently affected by static electricity compared with other components, and thus the screen split phenomenon occurs in the second display area of the display panel.

The inventor found the main reason for that the components in the pixel circuit layer which are located in the same row or column as the missing components in the first display area are differently affected by static electricity compared with other components is that the area of the portions formed by the various film layers corresponding to the missing components after the first display area is disconnected is less than the area of other continuous film layers, thus the portions are differently affected by static electricity, and the performance difference of the same components in the second display area is great.

Figure 2:
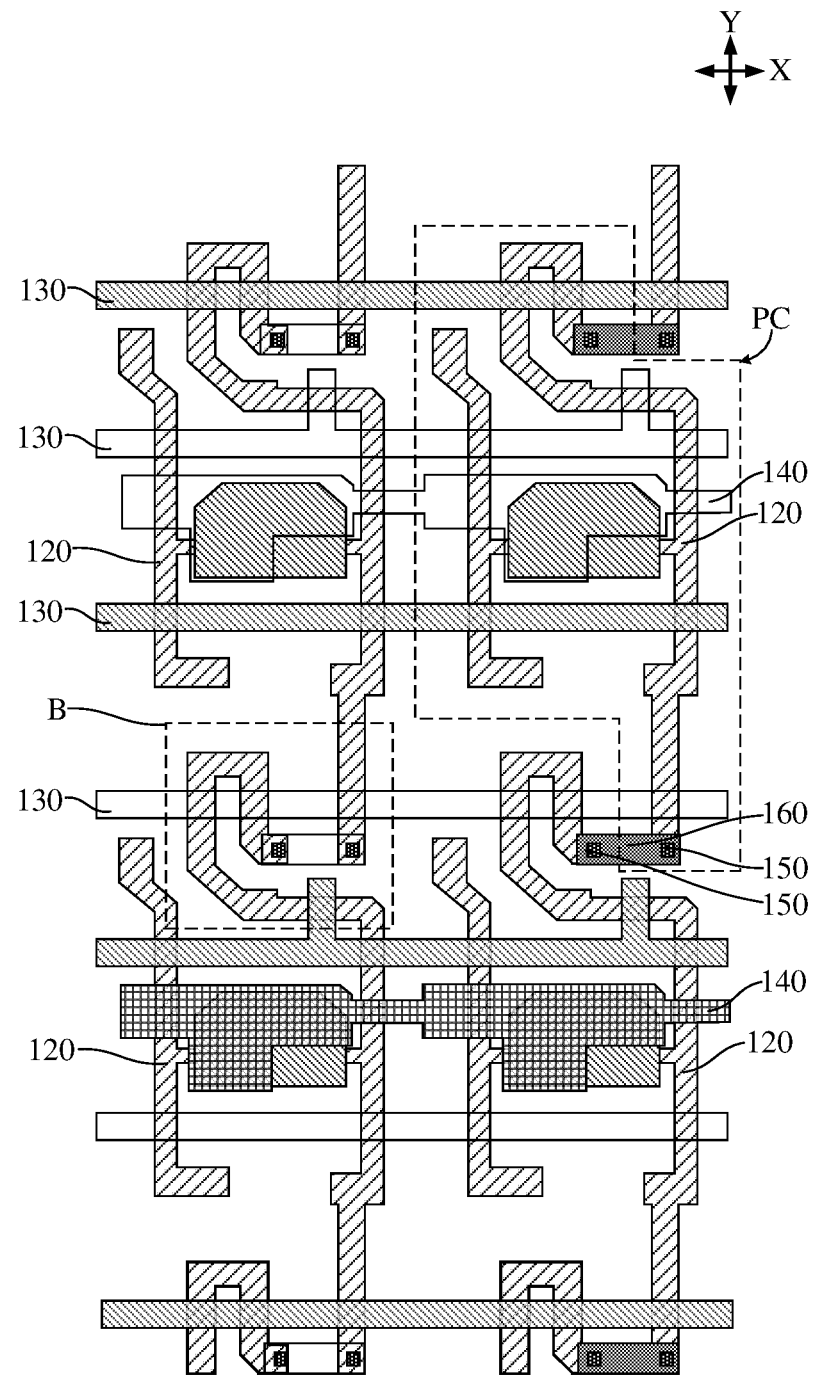
FIG. 2 shows a schematic structural diagram of a pixel circuit in a local area of a display panel according to an embodiment of the present application.
Figure 5:
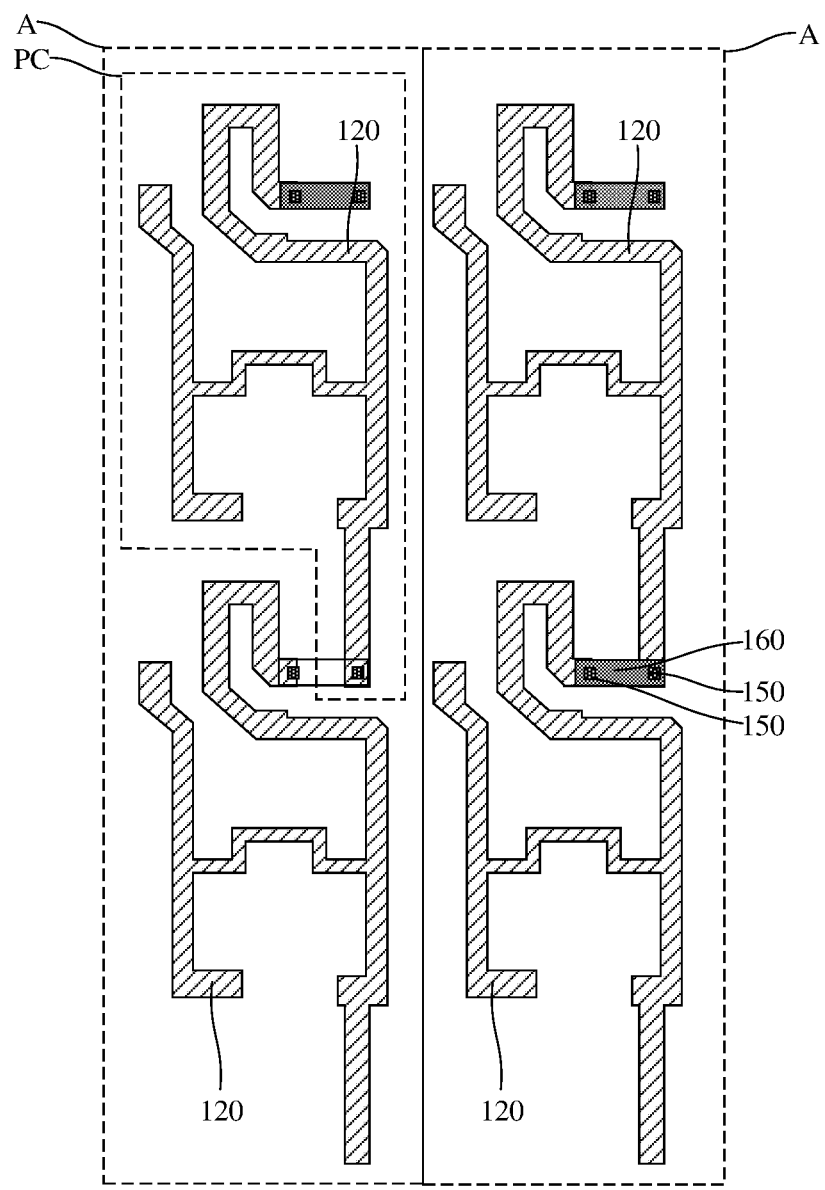
FIG. 5 shows a schematic structural diagram of a semiconductor layer of a pixel circuit in a local area of a display panel according to an embodiment of the present application.

Referring to FIGS. 1, 2 and 5 together, the embodiments of the present application provide a display panel 110 including a first display area DA1 and a second display area DA2 at least partially surrounding the first display area DA1, and a light transmittance of the first display area DA1 is greater than a light transmittance of the second display area DA2. The second display area DA2 includes a light-emitting element layer and a pixel circuit layer, and the light-emitting element layer includes a plurality of sub-pixels disposed in an array. The pixel circuit layer is arranged with a plurality of pixel circuits PC in one-to-one correspondence with the plurality of sub-pixels and includes a plurality of intermediate film layers for forming transistors in the pixel circuits. The plurality of intermediate film layers are arranged in a stacked manner and insulated from each other, each of the intermediate film layers includes a plurality of modules A disposed to be insulated from each other, each of the modules A includes functional parts for forming the transistors and non-functional parts 160 for connecting adjacent two of the functional parts, and in at least part of the modules A, at least part of the functional parts are disposed in a different layer from the non-functional parts 160.

The main reason for the performance difference of the same components due to static electricity is that in the second display area DA2, the areas of the portions, which are located in a same layer and continuous, of various film layers for forming the same components are different, and the less the area difference, the less the performance difference of the same components; the greater the area difference, the greater the performance difference of the same components.

In the display panel 110 according to the embodiments of the present application, in at least part of the modules A, at least part of the functional parts are disposed in a different layer from the non-functional parts 160, so that in the entire display panel 110, the area difference of the portions, which are located in a same layer and continuous, of the non-functional parts 160 and the functional parts of at least part of the intermediate film layers is reduced, thus the performance difference of the transistors is reduced, the screen split phenomenon of the display panel 110 is reduced or even eliminated, and the display effect is improved.

Figure 6:
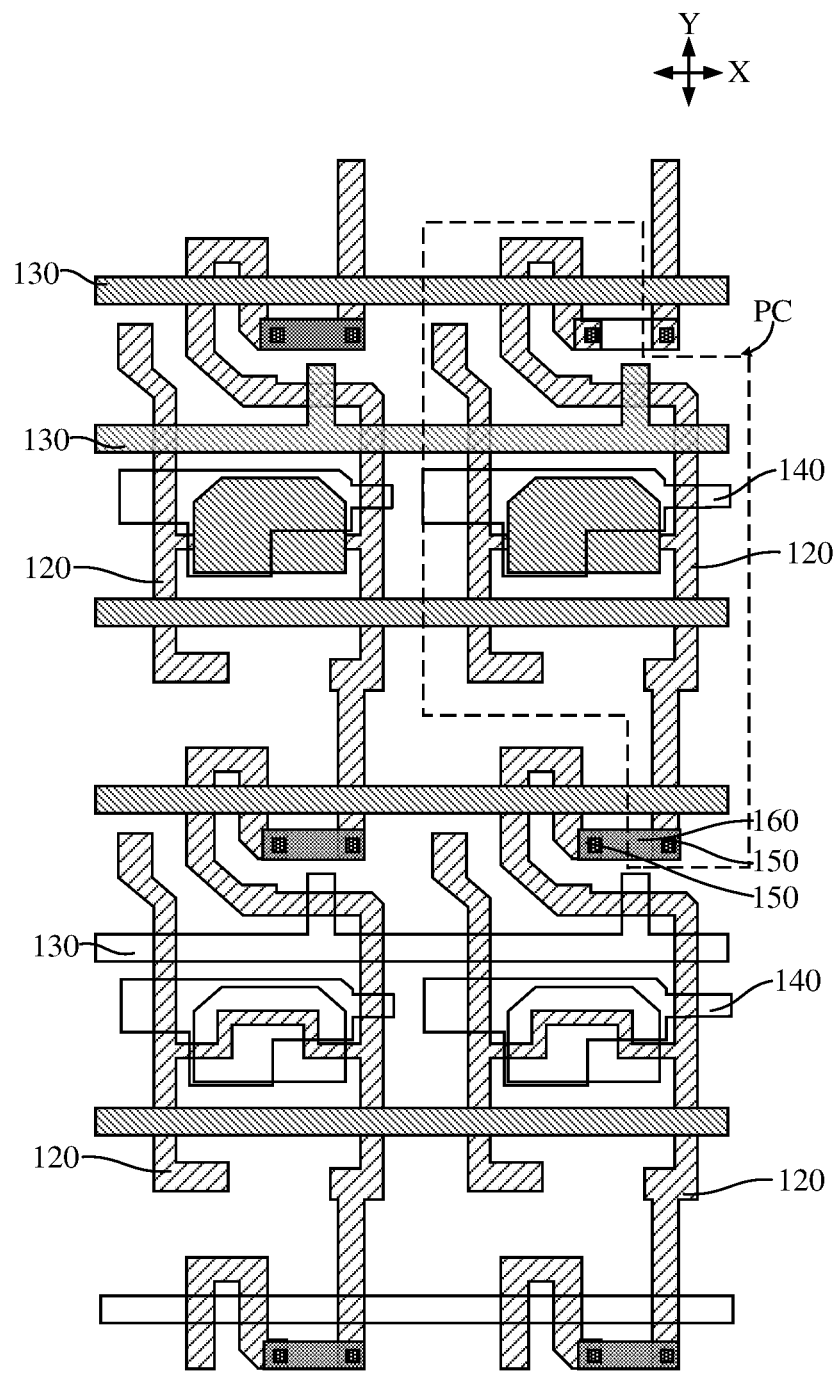
FIG. 6 shows a schematic structural diagram of a pixel circuit in a local area of a display panel according to another embodiment of the present application.

In an optional embodiment, as shown in FIG. 6, the pixel circuit layer further includes second metal layers 140 for forming upper plates of capacitors in the plurality of pixel circuits, and the second metal layers 140 of every adjacent two of the pixel circuits are spaced apart from each other.

In the display panel 110, the second metal layers 140 of adjacent ones of the pixel circuits are spaced apart from each other, so that the area difference of the continuous portions of the second metal layers 140 for forming upper plates of capacitors is reduced or eliminated, thus the performance difference of the transistors can be effectively reduced, the screen split phenomenon of the display panel 110 is reduced or even eliminated, and the display effect is improved. Since each of the second metal layers 140 of the pixel circuits is electrically connected to a power supply line for supplying a power supply signal, after the second metal layers 140 of adjacent ones of the pixel circuits are spaced apart from each other, the adjacent ones of the second metal layers 140 need not to be electrically connected.

Specifically, the intermediate film layer includes at least one of the semiconductor layer 120 for forming an active layer of a transistor and a first metal layer 130 for forming a gate.

As shown in FIGS. 2 and 5, the semiconductor layer 120 for forming an active layer of a transistor in the display panel 110 includes the plurality of modules A arranged in a first direction X, each of the modules A includes a plurality of the functional parts and the non-functional parts 160 arranged alternately, all of the functional parts in each of the modules are electrically connected to a same data line, and adjacent ones of the functional parts are electrically connected through the non-functional parts 160. Since a part of the semiconductor layer 120 corresponding to the first display area is removed, the area of the portions, which are located in a same layer and continuous, of some of the modules is reduced, and the performance difference of the same components is increased. In at least part of the modules A of the semiconductor layer 120, at least part of the non-functional parts 160 are disposed in a different layer from the functional parts, so that the area difference of the portions, which are located in a same layer and continuous, of the semiconductor layer 120 is reduced, thus the performance difference of the same components is reduced and the display effect is improved.

Figure 7:
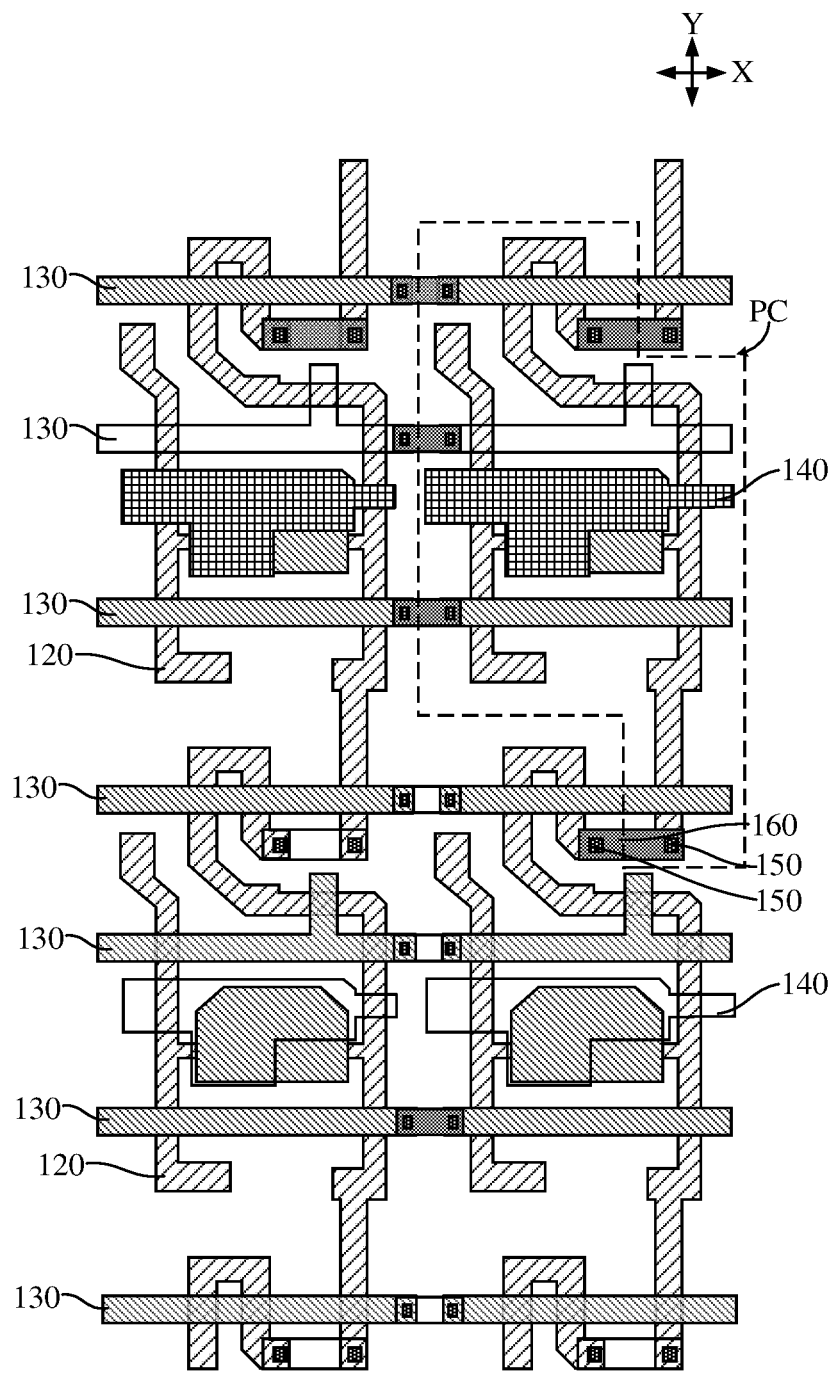
FIG. 7 shows a schematic structural diagram of a pixel circuit in a local area of a display panel according to yet another embodiment of the present application.

As shown in FIG. 7, the first metal layer 130 for forming a gate of a transistor in the display panel 110 includes the plurality of modules A arranged in a second direction Y perpendicular to the first direction X, each of the modules A includes a plurality of the functional parts and the non-functional parts arranged alternately, all of the functional parts in each of the modules are electrically connected to a same scan line, and adjacent ones of the functional parts are electrically connected through the non-functional parts 160. In at least part of the modules A of the first metal layer 130, at least part of the non-functional parts 160 are disposed in a different layer from the functional parts, so that the area difference of the portions, which are located in a same layer and continuous, of the first metal layer 130 is reduced, thus the performance difference of the same components is reduced and the display effect is improved.

In the display panel 110 according to the embodiments of the present application, as shown in FIGS. 2 to 7, the area difference of the portions, which are located in a same layer and continuous, of one or more of the semiconductor layer 120, the first metal layer 130 and the second metal layers 140 can be reduced to reduce the performance difference of the same components in the display panel 110, so as to reduce or even eliminate the screen split phenomenon and improve the display effect.

In an optional embodiment, the display effect of the display panel can be improved by adjusting the area difference of the portions of only one of the film layers, for example, the semiconductor layer. As shown in FIG. 2, in at least part of the modules A of the semiconductor layer, at least part of the non-functional parts 160 are disposed in a different layer from the functional parts, so that the area difference of the portions, which are located in a same layer and continuous, of the semiconductor layer is reduced to improve the display effect; the adjusting of the first metal layer is similar to that of the semiconductor layer and will not be repeated herein.

In another optional embodiment, the display effect of the display panel can be improved by adjusting the area difference of the portions, which are located in a same layer and continuous, of two of the film layers, for example, the semiconductor layer and the second metal layer. As shown in FIG. 6, in at least part of the modules A of the semiconductor layer, at least part of the non-functional parts 160 are disposed in a different layer from the functional parts, so that the area difference of the portions, which are located in a same layer and continuous, of the semiconductor layer is reduced to improve the display effect; the adjusting of the second metal layer is to dispose the second metal layers 140 of adjacent ones of the pixel circuits at intervals, so that the area difference of the portions, which are located in a same layer and continuous, of the second metal layer is reduced to improve the display effect. Alternatively, the area difference of the portions of the semiconductor layer and the first metal layer or the area difference of the portions of the first metal layer and the second metal layer may be adjusted, which is similar to the adjusting of the first metal layer and will not be repeated herein.

In yet another optional embodiment, the display effect of the display panel can be improved by adjusting the area difference of the portions of three of the film layers. As shown in FIG. 7, in at least part of the modules A of the semiconductor layer, at least part of the non-functional parts 160 are disposed in a different layer from the functional parts, so that the area difference of the portions, which are located in a same layer and continuous, of the semiconductor layer is reduced to improve the display effect; in at least part of the modules A of the first metal layer, at least part of the non-functional parts 160 are disposed in a different layer from the functional parts, so that the area difference of the portions, which are located in a same layer and continuous, of the first metal layer is reduced to improve the display effect; the adjusting of the second metal layer is to dispose the second metal layers 140 of adjacent ones of the pixel circuits at intervals, so that the area difference of the portions, which are located in a same layer and continuous, of the second metal layer is reduced to improve the display effect.

Specifically, the pixel circuit layer further includes a third metal layer for forming a source/drain of a transistor, and the third metal layer is disposed at a side of the intermediate metal layers facing the light-emitting element layer. For a part of the modules in the semiconductor layer 120, a first part of the non-functional parts 160 are disposed in a different layer from the functional parts, and among the first part of the non-functional parts 160, a part of the non-functional parts 160 are disposed in a same layer as the first metal layer 130, and/or a part of the non-functional parts 160 are disposed in a same layer as the third metal layer.

For a part of the modules in the first metal layer 130, a first part of the non-functional parts 160 are disposed in a different layer from the functional parts, and the first part of the non-functional parts 160 are disposed in a same layer as the third metal layer.

The pixel circuit layer includes a first insulating layer, the semiconductor layer 120, a second insulating layer, the first metal layer 130, a third insulating layer, the second metal layer 140, a fourth insulating layer and the third metal layer that are stacked in sequence. For a part of the modules in the semiconductor layer 120, a first part of the non-functional parts 160 are disposed in a different layer from the functional parts, and among the first part of the non-functional parts 160, a part of the non-functional parts 160 are disposed in a same layer as the first metal layer 130, and/or a part of the non-functional parts 160 are disposed in a same layer as the third metal layer, thus the manufacturing process for separately manufacturing the non-functional parts 160 in the semiconductor layer 120 can be reduced; and for a part of the modules in the first metal layer 130, a first part of the non-functional parts 160 are disposed in a different layer from the functional parts, and the first part of the non-functional parts 160 are disposed in a same layer as the third metal layer, thus the manufacturing process for separately manufacturing the non-functional parts 160 in the first metal layer 130 can be reduced.

Specifically, the portions of the intermediate film layers that are located in a same layer and continuous have a same area.

If the portions of the intermediate film layers that are located in a same layer and continuous have a same area, the performance difference of the same components is reduced to achieve a better display effect.

The present application it is not limited to that the portions of the intermediate film layers that are located in a same layer and continuous have a same area, the performance difference of the same components can also be reduced if, in the semiconductor layer and/or the first metal layer, a part of the functional parts are disposed in a different layer from the non-functional parts, and the display effect is better if the portions of the intermediate film layers that are located in a same layer and continuous have a same area.

Specifically, for each of the modules in the plurality of intermediate film layers, the non-functional parts 160 located between adjacent ones of the pixel circuits are disposed in a different layer from corresponding adjacent two functional parts, and all of the non-functional parts 160 and the functional parts within each of the pixel circuits are disposed in a same layer.

Figure 3:
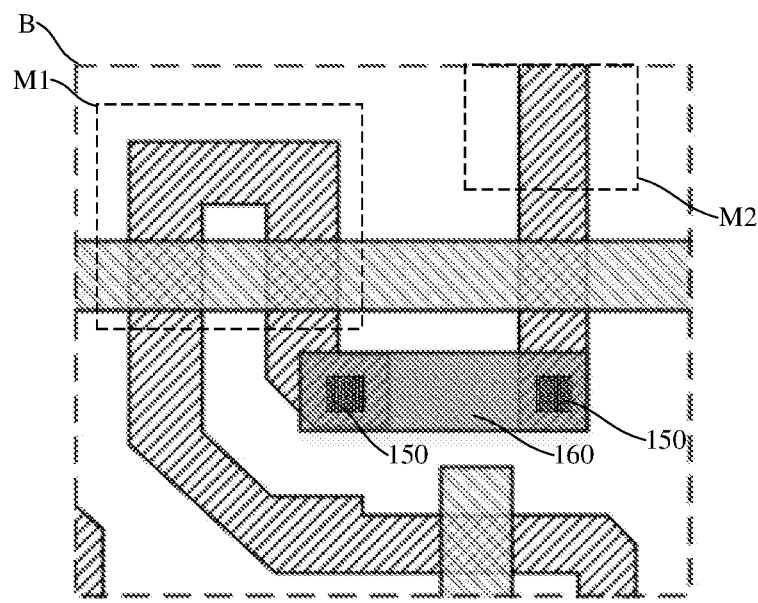
FIG. 3 shows a partial enlarged schematic diagram of area B in FIG. 2.
Figure 4:
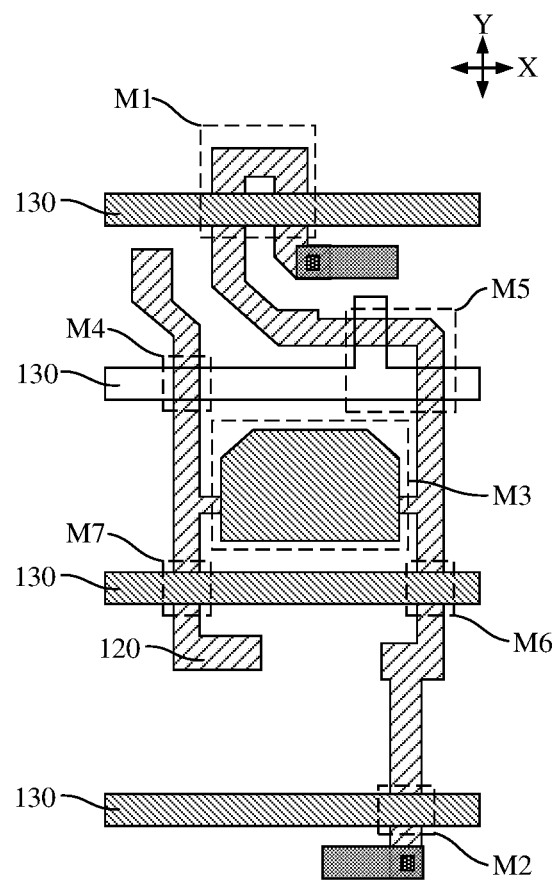
FIG. 4 shows a structural circuit diagram of a pixel circuit in a display panel according to an embodiment of the present application.

In an optional embodiment, as shown in FIG. 4, the pixel circuit PC is a 7T1C circuit, that is, including 7 transistors M1 to M7 and a storage capacitor. As shown in FIGS. 2 and 3, the modules A of the semiconductor layer are taken as an example for illustration, in which in adjacent two of the pixel circuits, the transistor M2 in one of the adjacent two of the pixel circuits is disposed adjacent to the transistor M1 in the other of the adjacent two of the pixel circuits, and the functional parts of the semiconductor layer for forming the transistor M2 and the transistor M1 are arranged in a different layer from the non-functional parts of the semiconductor layer located between the transistor M2 and the transistor M1, so that the semiconductor layers of adjacent ones of the pixel circuits are independent of each other and have the same area, and thus the performance difference of the transistors is reduced to improve the display effect of the display panel; the arrangement of the first metal layer is similar to that of the semiconductor layer and will not be repeated herein.

In the above embodiments, the portions, which are located in a same layer and continuous, of the intermediate film layers for all of the pixel circuits have a same area, so that the plurality of the pixel circuits are relatively independent and equally affected by the process, and thus the performance difference of the transistors is reduced and the screen split phenomenon can be reduced or even eliminated.

In other optional embodiment, within each of the pixel circuits, a part of the non-functional parts 160 are disposed in a different layer from the functional parts.

If, for the intermediate film layers between the pixel circuits, the non-functional parts 160 are not disposed in a different layer from the functional parts, then within each of the pixel circuits, a part of the non-functional parts 160 can be disposed in a different layer from the functional parts, so as to reduce the performance difference of the transistors under the conditions allowed by the process to reduce or even eliminate the screen split phenomenon.

Specifically, as shown in FIGS. 2, 6 and 7, under a condition that adjacent two of the functional parts are disposed in a different layer from the non-functional part 160 located between the adjacent two of the functional parts, the adjacent two of the functional parts and the non-functional part 160 located between the adjacent two of the functional parts are connected through vias 150.

When manufacturing the non-functional parts 160 disposed in a different layer from the functional parts, the functional parts may be manufactured first and then the non-functional parts 160, and the non-functional parts 160 and corresponding adjacent two functional parts are connected by vias 150.

The present application further provides another display panel 110 including a first display area and a second display area at least partially surrounding the first display area, and a light transmittance of the first display area is greater than a light transmittance of the second display area. The second display area includes: a light-emitting element layer including a plurality of sub-pixels disposed in an array; and a pixel circuit layer including a plurality of pixel circuits in one-to-one correspondence with the plurality of sub-pixels and second metal layers 140 for forming upper plates of capacitors, and the second metal layers 140 of every adjacent two of the pixel circuits are spaced apart from each other.

In the display panel 110 according to the present application, the performance difference of the same components in the display panel 110 can be reduced by merely reducing the area difference of the portions, which are located in a same layer and continuous, of the second metal layers 140 for forming capacitors, so as to reduce or even eliminate the screen split phenomenon and improve the display effect.

The present application further provides a display apparatus including any one of the display panels 110 according to the above technical solutions.

The display apparatus according to the present application can effectively reduce or even eliminate the screen split phenomenon and improve the display effect.

The above embodiments of the present application do not exhaustively describe all the details, nor do they limit the present application to merely the described specific embodiments. Obviously, according to the above description, many modifications and changes can be made. These embodiments are selected and specifically described in the specification to better explain the principles and practical applications of the present application, so that those skilled in the art can make good use of the present application and make modifications on the basis of the present application. The present application is only defined by the claims and their full scope and equivalents.

What is claimed is:

1. A display panel comprising a first display area and a second display area at least partially surrounding the first display area, a light transmittance of the first display area being greater than a light transmittance of the second display area, the second display area comprising:
    a light-emitting element layer comprising a plurality of sub-pixels disposed in an array; and
    a pixel circuit layer being arranged with a plurality of pixel circuits in one-to-one correspondence with the plurality of sub-pixels and comprising a plurality of intermediate film layers for forming transistors in the pixel circuits, the plurality of intermediate film layers being arranged in a stacked manner and insulated from each other, each of the intermediate film layers comprising a plurality of modules disposed to be insulated from each other, each of the modules comprising functional parts for forming the transistors and non-functional parts for connecting two adjacent functional parts, the functional parts are disposed in a different layer from the non-functional parts, and the non-functional parts and the two adjacent functional parts are electrically connected by vias.

2. The display panel of claim 1, wherein each of the intermediate film layers comprises at least one of a semiconductor layer for forming an active layer of a transistor and a first metal layer for forming a gate.

3. The display panel of claim 2, wherein the semiconductor layer comprises a part of the plurality of modules arranged in a first direction, each module of the plurality of modules comprises a plurality of the functional parts and the non-functional parts arranged alternately, all of the functional parts in each module of the plurality of modules are electrically connected to a same data line, and adjacent ones of the functional parts are electrically connected through the non-functional parts.

4. The display panel of claim 3, wherein the semiconductor layers of every adjacent two of the pixel circuits are independent of each other and have a same area.

5. The display panel of claim 2, wherein under a condition that the intermediate film layer comprises the first metal layer for forming the gate, the first metal layer comprises the plurality of modules arranged in a second direction, each of the modules comprises a plurality of the functional parts and the non-functional parts arranged alternately, all of the functional parts in each of the modules are electrically connected to a same scan line, and adjacent ones of the functional parts are electrically connected through the non-functional parts.

6. The display panel of claim 2, wherein the pixel circuit layer further comprises a third metal layer for forming a source/drain of a transistor, and the third metal layer is disposed at a side of the intermediate film layers facing the light-emitting element layer.

7. The display panel of claim 6, wherein for a part of the modules in the semiconductor layer, a first part of the non-functional parts are disposed in a different layer from the functional parts, and among the first part of the non-functional parts, a part of the non-functional parts are disposed in a same layer as the first metal layer, and another part of the non-functional parts are disposed in a same layer as the third metal layer.

8. The display panel of claim 6, wherein for a part of the modules in the semiconductor layer, a first part of the non-functional parts are disposed in a different layer from the functional parts, and the first part of the non-functional parts are disposed in a same layer as the first metal layer.

9. The display panel of claim 6, wherein for a part of the modules in the semiconductor layer, a first part of the non-functional parts are disposed in a different layer from the functional parts, and the first part of the non-functional parts are disposed in a same layer as the third metal layer.

10. The display panel of claim 6, wherein for a part of the modules in the first metal layer, a first part of the non-functional parts are disposed in a different layer from the functional parts, and the first part of the non-functional parts are disposed in a same layer as the third metal layer.

11. The display panel of claim 1, wherein the pixel circuit layer further comprises second metal layers for forming upper plates of capacitors in the plurality of pixel circuits, and the second metal layers of every adjacent two of the pixel circuits are spaced apart from each other.

12. The display panel of claim 11, wherein each of the second metal layers of the pixel circuits is electrically connected to a power supply line for supplying a power supply signal.

13. The display panel of claim 1, wherein portions of the intermediate film layers that are located in a same layer and continuous have a same area.

14. The display panel of claim 13, wherein for each of the modules in the plurality of intermediate film layers, the non-functional parts located between adjacent ones of the pixel circuits are disposed in a different layer from corresponding adjacent two functional parts, and all of the non-functional parts and the functional parts within each of the pixel circuits are disposed in a same layer.

15. The display panel of claim 13, wherein within each of the pixel circuits, a part of the non-functional parts are disposed in a different layer from the functional parts.

16. A display apparatus comprising the display panel of claim 1.

17. The display panel of claim 1, wherein, in an orthographic projection in a thickness direction, the non-functional part is located between two adjacent functional sections, and the two adjacent functional parts are electrically connected through the non-functional part located between the two adjacent functional sections.

18. The display panel of claim 17, wherein an orthographic projection of the via in the substrate is located in the orthographic projection in the thickness direction, and the orthographic projection of the via is located in the orthographic projection in the thickness direction of the non-functional part.

19. A display panel comprising a first display area and a second display area at least partially surrounding the first display area, a light transmittance of the first display area being greater than a light transmittance of the second display area, the second display area comprising:
a light-emitting element layer comprising a plurality of sub-pixels disposed in an array; and
a pixel circuit layer comprising:
a plurality of pixel circuits in one-to-one correspondence with the plurality of sub-pixels and second metal layers for forming upper plates of capacitors, and the second metal layers of every adjacent two of the pixel circuits being spaced apart from each other, and
a plurality of intermediate film layers for forming transistors in the pixel circuits, the plurality of intermediate film layers being arranged in a stacked manner and insulated from each other, each of the intermediate film layers comprising a plurality of modules disposed to be insulated from each other, each of the modules comprising functional parts for forming the transistors and non-functional parts for connecting two adjacent functional parts, the functional parts are disposed in a different layer from the non-functional parts, and the non-functional parts and the two adjacent functional parts are connected by vias.

20. The display panel of claim 19, wherein each of the second metal layers of the pixel circuits is electrically connected to a power supply line for supplying a power supply signal.

* * * * *